(12) United States Patent
Fernandez et al.

(10) Patent No.: US 10,852,329 B2
(45) Date of Patent: Dec. 1, 2020

(54) HIGH PRECISION CURRENT SENSING USING SENSE AMPLIFIER WITH DIGITAL AZ OFFSET COMPENSATION

(71) Applicant: Microchip Technology Incorporated, Chandler, AZ (US)

(72) Inventors: Marija Fernandez, Lausanne (CH); Philippe Deval, Lutry (CH)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 61 days.

(21) Appl. No.: 16/164,973

(22) Filed: Oct. 19, 2018

(65) Prior Publication Data

US 2019/0128932 A1 May 2, 2019

Related U.S. Application Data

(60) Provisional application No. 62/578,587, filed on Oct. 30, 2017.

(51) Int. Cl.

| | | |
|---|---|---|
| *G01R 19/25* | (2006.01) | |
| *H03F 3/45* | (2006.01) | |
| *H03F 1/30* | (2006.01) | |
| *G01R 15/14* | (2006.01) | |
| *G01R 19/00* | (2006.01) | |
| *G01R 1/20* | (2006.01) | |

(52) U.S. Cl.
CPC ....... *G01R 19/2506* (2013.01); *G01R 15/146* (2013.01); *G01R 19/0092* (2013.01); *H03F 1/30* (2013.01); *H03F 3/45071* (2013.01); *H03F 3/45475* (2013.01); *G01R 1/203* (2013.01); *H03F 2200/375* (2013.01); *H03F 2200/462* (2013.01); *H03F 2200/481* (2013.01); *H03F 2200/78* (2013.01); *H03F 2203/45588* (2013.01)

(58) Field of Classification Search
CPC combination set(s) only.
See application file for complete search history.

(56) References Cited

U.S. PATENT DOCUMENTS

| | | | |
|---|---|---|---|
| 5,498,984 A * | 3/1996 | Schaffer | G01R 19/0092 327/28 |
| 5,945,853 A | 8/1999 | Sano | 327/87 |
| 7,327,149 B2 * | 2/2008 | Chapuis | G01R 19/0092 323/282 |
| 2002/0180418 A1 | 12/2002 | Jones et al. | 324/118 |

(Continued)

OTHER PUBLICATIONS

Bergmann, J et al., "High Temperature Operational Amplifier with Low Offset Voltage," Proceedings of International Symposium on Signals, Systems, and Electronics, pp. 451-454, Oct. 25, 1995.

(Continued)

*Primary Examiner* — Jay Patidar
(74) *Attorney, Agent, or Firm* — Slayden Grubert Beard PLLC

(57) ABSTRACT

A current sensing circuit includes a current sense amplifier and a correction circuit. The current sense amplifier has an offset voltage. The correction circuit is configured to evaluate the offset voltage of the current sense amplifier. The correction circuit is further configured to issue a correction signal to the current sense amplifier based upon the evaluated offset voltage. The correction signal is to adjust the offset voltage.

20 Claims, 3 Drawing Sheets

(56) References Cited

U.S. PATENT DOCUMENTS

2016/0141957 A1* 5/2016 Ozawa ............... H02M 3/156

OTHER PUBLICATIONS

Kayal, M. et al., "An Automatic Offset Compensation Technique Applicable to Existing Operational Amplifier Core Cell," Proceedings of the IEEE Custom Integrated Circuits Conference, pp. 419-422, Mar. 1, 1998.

Pastre, M. et al., "A Digital Calibration Methodology and its Application to a Hall Sensor Microsystem," Journal of Control Engineering and Applied Infomatics, vol. 8, No. 3, pp. 23-31, Dec. 31, 2006.

International Search Report and Written Opinion, Application No. PCT/US2018/057441, 15 pages, Jan. 25, 2019.

* cited by examiner

HIGH PRECISION CURRENT SENSING USING SENSE AMPLIFIER WITH DIGITAL AZ OFFSET COMPENSATION

PRIORITY

This application claims priority to U.S. Provisional Application No. 62/578,587 filed Oct. 30, 2017, the contents of which are hereby incorporated in their entirety.

FIELD OF THE INVENTION

The present disclosure relates to current sensing and measurement and, more particularly, to a high-precision current sensing using a sense amplifier with digital Auto-Zero (AZ) offset compensation.

BACKGROUND

Current sensing and measurement are commonly performed in all electronics applications related to power delivery for direct current (DC) and alternating current (AC), like DC/DC convertors, AC/DC convertors, motor drivers, light emitting diode (LED) drivers, battery chargers, universal serial bus (USB) powered electronics and many other applications. One example use of current sensing and measurement is in power regulation. As higher efficiency for low power applications is sought, more and more linear regulator solutions are being replaced by switching regulator solutions. Current sensing through a shunt resistor may be used to control the switching regulator power supply, and current sensing precision may factor into the performance of such regulators. Another typical example of applications where current sensing and measurement are commonly used is in USB powered electronics. The USB load switches must provide load protection by measuring current very accurately and limiting power delivery.

Sensing and measurement of a current in power regulators, USB power switches, and other circuits is commonly performed using a current sense amplifier (SA) circuit. SA circuits are used in different sensing schemes, like shunt resistor current sensing topologies, or power switch and sense field-effect transistor (FET) current sensing topologies. Sensing of the current in a load may be performed by probing the voltage drop on a sensing element (such as a current shunt resistor or sensing FET). The offset of the SA circuit may define the accuracy of measurement. The offset of the SA circuit may be referenced as "Vos". The voltage drop across the sensing element may be referenced as "Vdrop". Globally, the error induced by the SA circuit offset is equal to Vos/Vdrop.

SUMMARY

Embodiments of the present disclosure may include a current sensing circuit. The current sensing circuit may include a current sense amplifier. The current sensing circuit may include a correction circuit configured to evaluate an offset voltage of the sense amplifier, and to issue a correction signal to the sense amplifier based upon the evaluated offset voltage. In combination with any of the above embodiments, the correction circuit may be further configured to evaluate the offset voltage and issue the correction signal continuously. In combination with any of the above embodiments, the correction circuit may be further configured to use a comparator connected to the inputs of the sense amplifier to control a digital integrator configured to generate the correction signal. In combination with any of the above embodiments, the correction circuit may be further configured to use the comparator and the digital integrator to generate the correction signal as an input of a digital to analog converter (DAC). In combination with any of the above embodiments, the correction circuit may be further configured to use the DAC to close a feedback loop of the digital Auto-Zero compensation of the sense amplifier. In combination with any of the above embodiments, the correction circuit may be further configured to convert the offset voltage to the correction signal continuously in order to prevent degradation due to a temperature drift of the offset compensation. In combination with any of the above embodiments, the current sensing circuit may have a shunt resistor topology. In combination with any of the above embodiments, the current sensing circuit may have a sensing FET transistor topology.

Embodiments of the present disclosure may include an apparatus including a DC/DC converter, AC/DC converter, motor driver, LED drivers, battery chargers, or USB electronic device including any of the current sensing circuits of the above embodiments.

Embodiments of the present disclosure may include methods performed by any of the current sensing circuits or apparatuses of the above embodiments.

DETAILED DESCRIPTION

Figure 1:
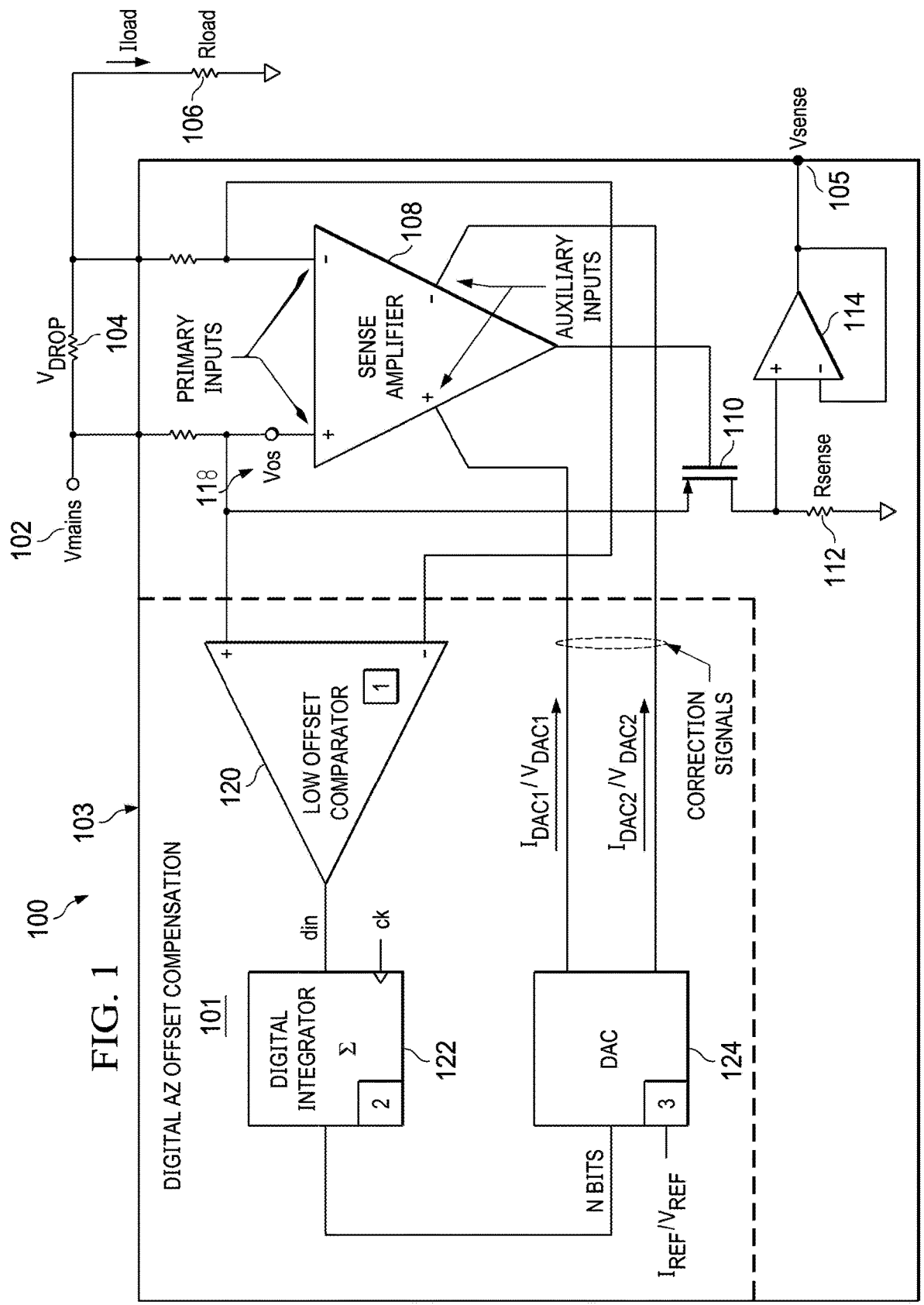
FIG. 1 is an illustration of an example system for high precision current sensing, according to embodiments of the present disclosure.

FIG. 1 is an illustration of an example system 100 for high precision current sensing, according to embodiments of the present disclosure. System 100 may include an offset compensation circuit (OCC) 101 configured to perform high precision current sensing by detecting an offset and providing adjustments for the offset. OCC 101 may be used to detect offset and provide adjustments for any suitable circuit, such as current sensing circuit 103.

Figure 2:
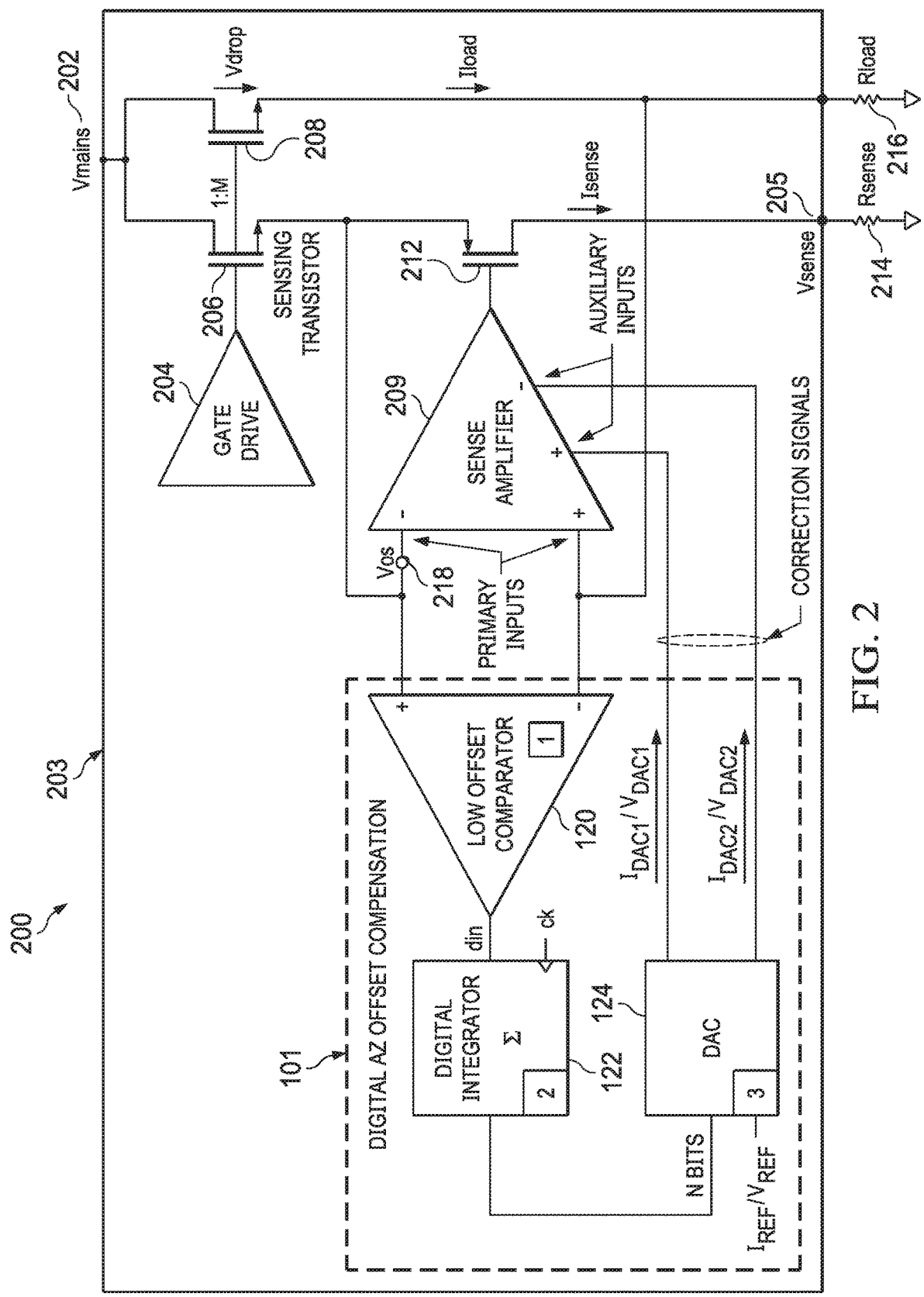
FIG. 2 is an illustration of another example system for high precision current sensing, according to embodiments of the present disclosure.

FIG. 2 is an illustration of another example system 200 for high precision current sensing, according to embodiments of the present disclosure. System 200 may include an instance of OCC 101 configured to perform high precision current sensing by detecting an offset and providing adjustments for the offset in another current sensing circuit 203.

Although current sensing circuits 103, 203 are shown in FIGS. 1-2 as example circuits for which OCC 101 may be configured to perform offset detection and adjustment, OCC 101 may be configured to perform such operations on any suitable circuit. Offset of current sensing circuits may strongly affect the accuracy of current sensing and measurement. Thus, OCC 101 may be configured to compensate for such an offset.

OCC 101 may be configured to compensate for offset for current sense amplifier. OCC 101 may be configured to compensate for offset in a digital, AZ manner. The compensation generated by OCC 101 may be applied continuously to the current sensing circuit to reduce the offset and to compensate for any offset drift, wherein the offset may vary over time. The offset may vary over time as, for example, temperature changes.

As discussed above, a current sensing circuit such as current sensing circuits 103, 203 used with digital AZ offset compensation from OCC 101 may be included in any suitable current sensing topology. Accordingly, OCC 101 may be configured to be used in any suitable application using such a suitable current sensing topology. For example, current sensing circuit 103 illustrates current sensing with a shunt resistor current sensing topology. In another example, current sensing circuit 203 illustrates current sensing with a sensing transistor current sensing topology. Each of current sensing circuits 103, 203 may act as analog front-ends and may be configured to generate an output voltage, Vsense (105, 205), in response to the measured current. Vsense, may be provided to an analog-to-digital converter (ADC) (not shown). The ADC may be configured to determine, for a given Vsense, a proportional current. The ADC may be configured to generate a digital output value that corresponds to the measured current.

Current sensing circuit 103 of FIG. 1 may include a voltage Vmains 102 that includes a signal that is to be observed for current. Vmains 102 may be a voltage supply of the sensing circuit, DC/DC regulators, USB, or may be another bus voltage. Current sensing circuit 103 may include a sense amplifier 108 configured to sense the current supplied by Vmains 102. In one embodiment, sense amplifier 108 may be configured to be compensated-for by OCC 101. Current sensing circuit 103 may include a shunt resistor 104 connected to a load resistor 106. Voltage drop across shunt resistor 104 may be designated as Vdrop. In some cases, any suitable adder type of charge (such as resistive, capacitive, inductive, or load switch) may be used in place of load resistor 106. Shunt resistor 104 may be connected across the pins of sense amplifier 108. Sense amplifier 108 may be configured to amplify voltage Vdrop, and thus detect the load current. Placing shunt resistor 104 in series with the current path to be measured generates Vdrop as a differential voltage. Sense amplifier 108 may be configured to convert the small, differential voltage across its input pins to a larger voltage that can be accurately digitized by an ADC (not shown). The value of shunt resistor 104 may be chosen to minimize power lost in the process of measuring the current.

Output of sense amplifier 108 may be configured to drive a gate of a transistor 110. Transistor 110 may be configured to connect one input of sense amplifier 108 to a sense resistor 112 and a positive input of another op-amp 114. Sense resistor 112 may be internal or external (see sense resistor 214 in FIG. 2). Op-amp 114 may be connected as a buffer. Op-amp 114 may be optional. Furthermore, op-amp 114 may generate the output of current sensing circuit 103 as Vsense 105. Thus, op-amp 114 may have a voltage across sense resistor 112 as its input. Output of op-amp 114 may closely follow its input voltage.

Current sensing circuit 203 of FIG. 2 may include a Vmains voltage 202 that is a voltage supply of the sensing circuit. Current sensing circuit 203 may be configured to measure the current flowing from Vmains 202 through a load 216. Load 216 may be implemented by any suitable type of load or adder type of charge, such as resistive, capacitive, inductive, or a load switch.

Current sensing circuit 203 may include a gate drive 204 configured to turn transistors 206, 208 "on" or "off". A ratio of comparative current between transistors 206, 208 may be given as 1:M. Transistors 206, 208 may be n-channel or p-channel metal-oxide semiconductor field-effect transistors (MOSFETs). However, n-channel MOSFETs, as shown in FIG. 2, may be preferred due to a lower "on" resistance for a given area compared to p-channel MOSFETs. Transistor 206 may be used as a sensing switch, with the drain of transistor 206 connected to Vmains 202 and the source of transistor 206 communicatively coupled with a sense resistor 214. Sense resistor 214 may be internal or external (see sense resistor 112 in FIG. 1). Transistor 208 may be used as a load switch, with the drain of transistor 208 (a source if transistor 208 is instead a PMOS) connected to Vmains 202 and the source of transistor 208 (a drain if transistor 208 is instead a PMOS) to load 216.

An isolating transistor 212 may be inserted in order to ensure voltage isolation between sensing switch 206 and sense resistor 214. Transistor 312 may be a n-channel or p-channel MOSFET, and in the example of FIG. 2, a p-channel MOSFET is used. In the example of FIG. 2, the source of transistor 212 is connected to the source of transistor 206 and the drain of transistor 212 is connected to sense resistor 214. The gate of transistor 212 may be driven through sense amplifier 210.

The combination of sense amplifier 210 and isolating transistor 212 may be configured to force the voltage drop across sensing transistor 206 to be equal to the voltage drop across load transistor 208. Thus, the current flowing into sensing transistor 206 is equal to 1/M times the load current.

The above description assumes an ideal amplifier. However, a real implementation of the amplifier has an input offset voltage, which may be referred to, respectively, as Vos 118, 218. Vos 218 may induce a voltage difference equal to Vos voltage between the voltage drop across the sensing transistor 206 and load transistor 208, which may lead to a sensing current error. Similarly, Vos 118 may induce a voltage difference.

In a first approximation, the relative error induced by Vos 118, 218 may be equal to Vos/Vdrop. Therefore, to reach an accuracy of x % in the current measurement, the absolute value for Vos 118, 218 must be less than x % of Vdrop. As explained above, Vdrop should be as low as possible to minimize power loss. Typically, Vdrop may be in the 10-100 mV range. Therefore, given a desired 1% accuracy and a Vdrop of 10 mV, Vos 118, 218 must be less than 100 uV. Such a low value of Vos 118, 218 may be difficult to achieve. OCC 101 may be configured to reduce Vos values.

Moreover, temperatures or other environmental factors may cause Vos values to change over time. OCC 101 may be configured to adjust sense amplifier values for changes in Vos values. OCC 101 may be configured to perform digital AZ offset compensation for compensating the sense amplifier offsets for sense amplifiers such as sense amplifiers 108, 209, or any other suitable sense amplifier. OCC 101 may thus improve the precision of current sensing and measurement. Digital AZ compensation may include sensing of the offset of sense amplifiers 108, 209 at their respective primary inputs. The sensed offset may be converted into a digital correction signal. The digital offset correction signal may be translated into the analog domain, and the resulting analog offset correction signal may be further applied to the auxiliary inputs of sense amplifiers 108, 209 for offset compensation.

When sense amplifiers 108, 209 have both of their inputs connected to nodes that should have the same voltages, the offset Vos may be sensed using a very low offset comparator that is connected to inputs of sense amplifiers 108, 209. The very low offset comparator may be implemented by comparator 120. Comparator 120 may be configured to compare the voltages at two inputs of sense amplifiers 108, 209 and thus sense Vos 118, 218. Comparator 120 output may control a digital integrator (DI) 122. DI 122 may be configured to generate a digital correction signal serving as an input of a digital-to-analog converter (DAC) 124. DAC 124 may be configured to convert the digital correction signal into the analog domain. DAC 124 may be configured to provide its analog output to sense amplifiers 108, 209, thus closing the feedback loop of sense amplifiers 108, 209 offset compensation system. DAC 124 may be configured to generate a compensation current or a compensation voltage signal. The compensation signal may be a differential signal and provided to auxiliary inputs of sense amplifiers 108, 209. OCC 101 may thus be configured to convert offset voltage Vos 118, 218 to a correction current or voltage. OCC 101 may be configured to provide this compensation continuously in order to prevent any degradation of the offset compensation related to offset temperature drift. The elements of OCC 101 such as comparator 120, DI 122, and DAC 124 may be implemented by analog circuitry, digital circuitry, or any suitable combination thereof.

OCC 101 may be configured to operate continuously or discontinuously. OCC 101 may be configured to operate continuously as shown in FIGS. 1 and 2, wherein signals from the input pins of sense amplifiers 108, 209 are received at OCC 101 and OCC 101 processes the signals. OCC 101 may be configured to be enabled or disabled in any suitable way, such as with enable signals, configuration registers, withholding clock signals, switches, disconnecting OCC 101 from the sense amplifiers, or other mechanisms. When OCC 101 is disabled, compensation signals to sense amplifiers 108, 209 may be maintained at their existing values.

In order to quickly and accurately compensate the offset Vos 118, 218 of sense amplifiers 108, 209, operation of OCC 101 may be divided into two steps. In a first step, a fast but coarse resolution algorithm may be used to quickly reduce the offset to a low level. This first step may be referenced as a Fast Offset Search Mode (FOSM). In a second step, a fine resolution algorithm may be used to accurately compensate the remaining offset after FOSM. This second step may last as long as OCC 101 or sense amplifiers 108, 209 are enabled in order to compensate any drift of offset of sense amplifiers 108, 209. This second step may be referenced as an Offset Tracking Mode (OTM).

In one embodiment, FOSM may be performed through successive approximation digital integrator operation that will quickly find a digital value to provide to DAC 124 in order to compensate the initial values of the offset of sense amplifiers 108, 209. In another embodiment, OTM may be performed with an up/down counter as an implementation of DI 122 that will increase or decrease the DAC code of DAC 124 by 1 least significant bit (LSB) at each update clock period. The resolution of the offset compensation is equal to the LSB amplitude of the DAC. DI 122 may include mechanisms for performing both FOSM and OTM. Furthermore, DI 122 may include or be communicatively coupled to control logic for switching between FOSM and OTM. DI 122 may switch from FOSM to OTM after a few cycles of successive approximation in FOSM. For example, DI 122 may switch after 6-8 clock cycles.

Any algorithm may be used by DI 122 to perform FOSM and OTM. Successive approximation may fulfill trade-offs to quickly find in a few clock cycles the initial offset cancellation digital code. These may include, for example, 6 to 8 clock cycles, or more if the resolution is not sufficient.

Once FOSM is performed, the operating mode of DI 122 may be alternated to OTM. Such trade-offs may include speed versus accuracy.

OTM may be a slow but accurate offset compensation. OTM may take several update clock periods to reach final offset compensation after FOSM. However, OTM may allow a very low final offset for sense amplifiers 108, 209. Once final offset is reached, the effective offset will oscillate within +/−1 LSB around zero. This oscillation may induce a small noise ray at half the offset compensation frequency while OTM is performed during operation of sense amplifiers 108, 209. However, in most applications, this ray might not be problematic, particular when compared to the accuracy gains of maintaining OTM to ensure that any drift due to low frequency noise, temperature change, supply voltage change, or other causes will be compensated within +/−1 LSB.

In other embodiments, any implementation of DI 122 having a at least an equal or higher resolution than an implementation of the successive approximation integrator (used to implement DI 122 during FOSM) may be used for OTM.

Additionally, some of the clock cycles of OCC 101 can be used periodically to compensate the offset of the comparator by a mean of the analog auto-zero offset compensation (AZ compensation) or another offset compensation scheme. The analog AZ compensation may include using one clock cycle for sampling comparator 120 input offset using a capacitor. During this clock cycle, the comparator may be disconnected from the OCC and the comparator inputs may be connected together (shorted), and its offset may be measured and stored on the offset compensation capacitor. The second clock cycle is needed for the analog AZ compensation for subtracting the sampled comparator offset from the comparator input signal, resulting in a very low offset comparator required for the digital AZ compensation. In practice, the analog voltage stored on the compensation capacitor degrades over time. Accordingly, this value may be stored or refreshed periodically. Periodic refresh also cancels the offset drift of the comparator] Any other way to compensate the offset of comparator 120 may be used.

In one embodiment, FOSM and OTM may be merged into a single mode when both modes have the same resolution. The DAC LSB value or weight corresponding to the successive approximation implementation of DI 122 is equal to the LSB weight corresponding to an up/down counter implementation of DI 122. In this merged mode, the offset compensation starts with FOSM mode as described above. After FOSM finishes, operation continues as with an up/down counter adding or subtracting 1 LSB at each update clock period as appropriate.

The slope of the offset cancellation during OTM is limited due to the size or weight of the DAC LSB when translated into compensation. Specifically, the slope is limited to Vlsb/Toc, wherein Vlsb is the LSB amplitude or weight, and Toc is the offset compensation period. Thus, for example, if the LSB amplitude is 1 uV and the offset frequency compensation period is 1 ms, the slope of the offset compensation is 1 uV/ms (1 mV/s). In other words, 1 s would be required to compensate an offset of 1 mV. This may be too slow to accurately track a sudden change of the offset. Therefore, an adaptive algorithm may be used during OTM.

As an example, the algorithm may decide to add or subtract 2 DAC LSBs—as opposed to 1 LSB—when tracking saturation is detected. During normal OTM conditions, the correction codes may oscillate between +/−1 LSB during each clock period of OCC 101. Sometimes, the correction codes may be +1 (or −1) LSB during two successive clock periods of OCC 101 then continues to oscillate between +1 and −1 LSB at each offset cancellation clock period. Tracking saturation occurs when the correction code remains the same during several offset cancellation clock periods. Then if the tracking saturation remains after the correction code has been increased to 2 LSB it can be further increased to 4 LSB, or any other value, and so on until tracking saturation ends.

Tracking saturation may end when the correction code starts to toggle again. Subsequently, the amplitude of the correction code may be reduced again, whether directly to 1 LSB or through a binary weighted process.

In order to spread offset compensation noise, some clock periods of OCC 101 may be randomly skipped, the offset compensation frequency dithered, or the amplitude of the digital correction code dithered.

Figure 3:
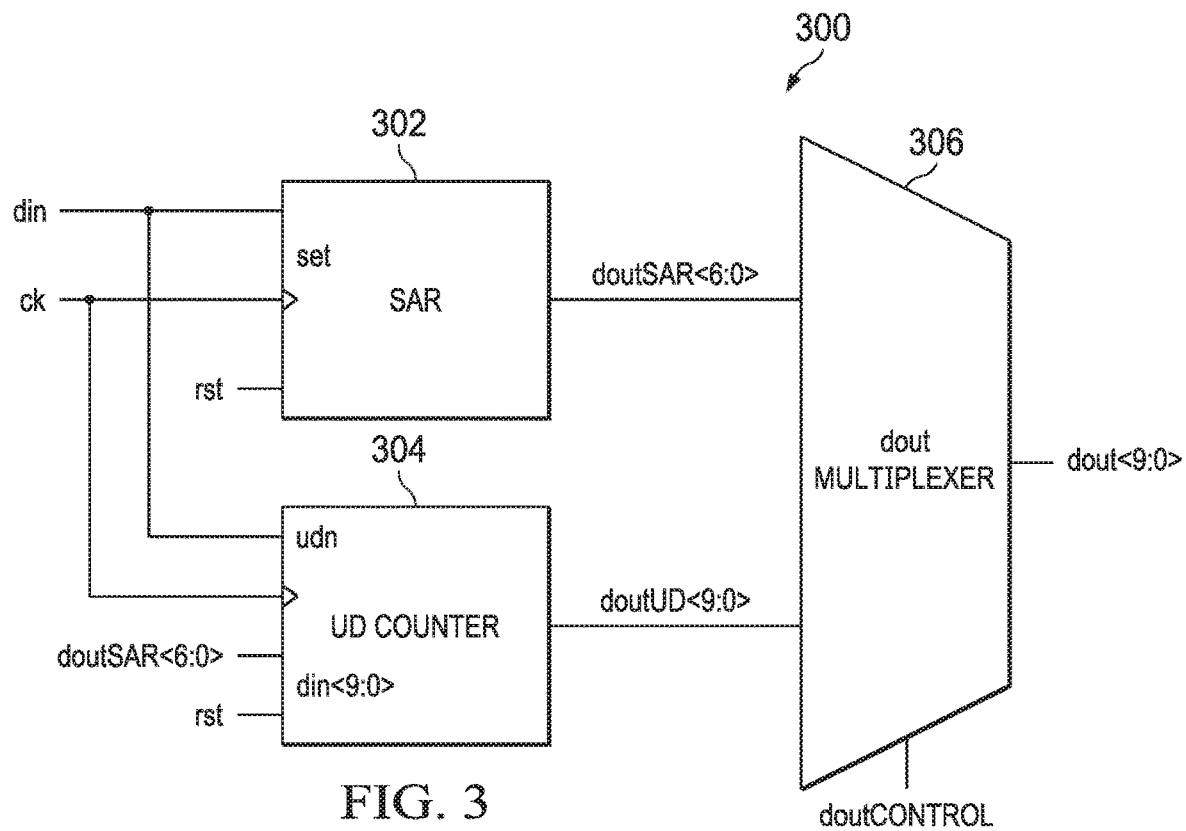
FIG. 3 is an illustration of a digital integrator for continuous digital AZ offset compensation, according embodiments of the present disclosure.

FIG. 3 is an example implementation of a digital integrator 300 for continuous digital AZ offset compensation, according embodiments of the present disclosure. In the example of FIG. 3, DI 300 may include a successive approximation register (SAR) 302, an up/down counter 304, and an output multiplexer 306.

In this example, the weight of the correction code may vary (e.g., +/−128, +/−64, . . . +/−4, +/−2, +/−1) during FOSM then remain +/−1 during OTM. In the example above the weight of the correction code is binary weighted. However, any weighting profile may be used. In this example the final resolution would be 8-bit. However, higher final resolution may be achieved. For example, FOSM may be started with higher a weight such as 512 for 10-bit resolution, requiring a longer time for FOSM (10 cycles rather than 8 in the example). Also, FOSM, may be applied to the 8 most significant bits during 8 cycles before changing to OTM. In such a case, only a coarse offset will be achieved at the end of the FOSM and the final accurate offset compensation will only be reached after a few cycles of OTM (4 for 10-bit integrator, 8 for 11-bit, etc.). This method induces slightly longer time for offset compensation than with a full range (10 bits, 11 bits) FOSM. However, it has the advantage being compatible with 8-bit register architecture for SAR 302.

SAR 302 may receive the digital output of comparator 120. SAR 302 may be configured to initially approximate the correction value for the offset voltage through permutations of values that, when applied to sense amplifiers 108, 209, increase or decrease offset voltage. The lowest resulting offset voltage may be selected after few cycles of the successive approximation. DI 300 may continually supply a code associated with such a correction of offset voltage to the DAC. Selection of output of SAR 302 as output of DI 300 may be made by multiplexer 306. Control of multiplexer 306 may be made by control logic evaluating the continual update of offset correction to determine modes of operation.

Following approximation of the initial value of the correction for the offset voltage using SAR 302, a continuous tracking mode may be entered. This may be an OTM mode. The tracking mode may be performed for changes in offset voltage that will require changes in the generated correction signal. In one embodiment, the tracking mode may be performed by an up/down counter 306. Counter 306 may accept as input the output of SAR 302 and the digital output of comparator 120. To switch modes, multiplexer 304 may be used to switch between output of SAR 302 and output of counter 306 to be applied to DAC 124 to generate the correction voltage or current.

Counter 306 may be configured to adjust the correction code up or down a single bit, or a multiple of a bit. Thus, as temperatures change and the offset voltage of sense amplifiers 108, 209 change, such a change may yield data changes recognized by counter 306, leading to a change in the correction code.

Figure 4:
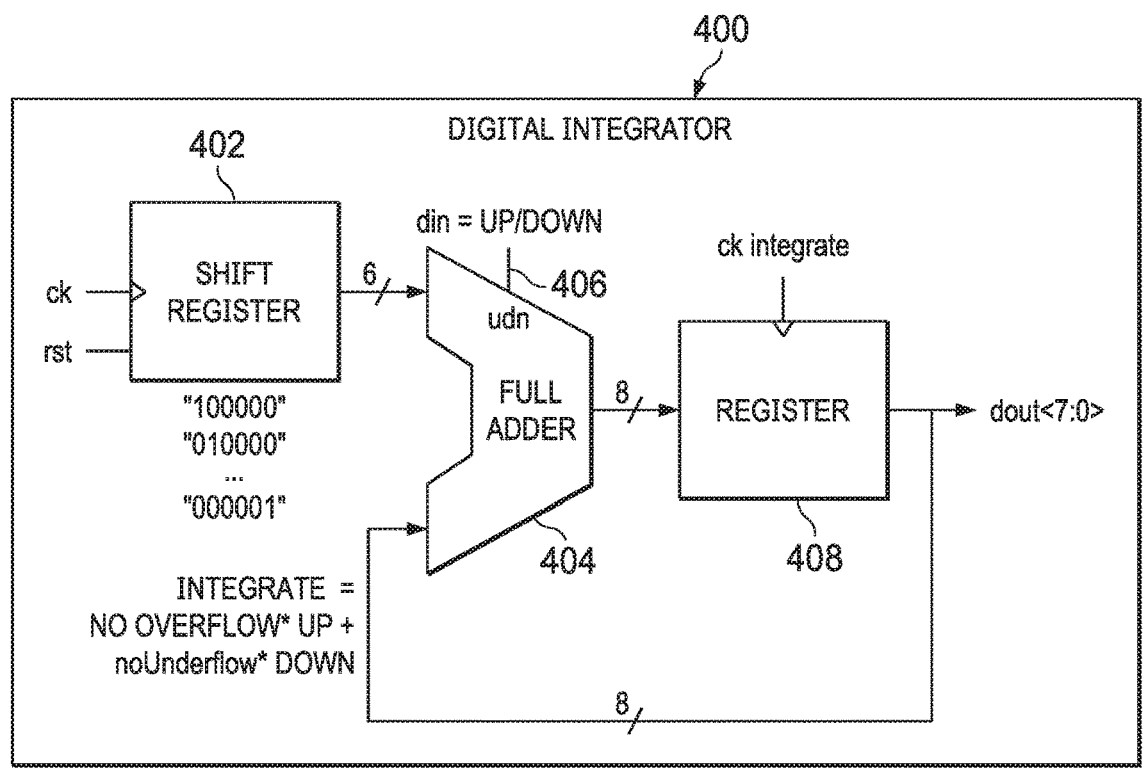
FIG. 4 is an illustration of another digital integrator for continuous digital AZ offset compensation, according embodiments of the present disclosure.

FIG. 4 is another example of a digital integrator 400 for continuous digital AZ offset compensation, according embodiments of the present disclosure. DI 400 may be implemented by, for example, a 6-bit shift register 402 for successive approximation; an 8-bit full adder 404 with up/down input 406 an input from shift register 402; and an output register 408. In this example, 6 bits may be used for successive approximation in an 8-bit DI. Any other suitable configuration for resolution of the DI, the number of bits of shift register 402, adder 404, and output register 408, and consequently for resolution of DAC 124 may be chosen within DI 400 for digital AZ offset compensation. The DAC resolution (number of bits) may be chosen to be equal to the resolution of the implemented DI 400 or to be lower than DI 400 resolution. Different FOSM and OTM modes may be accomplished by adjusting a weight of correction code. For example, FOSM may be started with less resolution used for these elements, followed by OTM with more resolution used for these elements.

Digital integrators 300, 400 may implement digital integrator 122.

Accordingly, the offset voltage Vos 118, 218 may be converted by OCC 101 to a correction voltage or current and then compensated continuously by sense amplifiers 108, 209 in order to prevent the degradation with a temperature drift. Embodiments of the present disclosure enable digital tuning with AZ of the SA offset. This digital tuning may be enabled or disabled from system 100 or system 200. The SA offset can be reduced to very low value, depending on the offset of the low-offset comparator and depending on the DAC resolution. The digital tuning may be performed at any suitable time, such as on demand at start-up only, periodically, randomly, or continuously. Continuous tuning may prevent degrading of temperature accuracy of current measurement through continuous adjustment. This may be compatible with all topologies of SA.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

We claim:

1. A current sensing circuit, comprising:
a current sense amplifier; and
a correction circuit configured to:
evaluate an offset voltage of the current sense amplifier;
issue a correction signal to the current sense amplifier based upon the evaluated offset voltage; and
use a comparator connected to the inputs of the sense amplifier to control a digital integrator configured to generate the correction signal.

2. The current sensing circuit of claim 1, wherein the correction circuit is further configured to evaluate the offset voltage and issue the correction signal continuously.

3. The current sensing circuit of claim 1, wherein the correction circuit is further configured to use the comparator and the digital integrator to generate the correction signal as an input of a digital to analog converter (DAC).

4. The current sensing circuit of claim 3, wherein the correction circuit is further configured to use the DAC to close a feedback loop of digital Auto-Zero compensation of the current sense amplifier.

5. The current sensing circuit of claim 1, wherein the correction circuit is further configured to convert the offset voltage to the correction signal continuously in order to prevent degradation due to a temperature drift of an offset compensation.

6. The current sensing circuit of claim 1, wherein the current sensing circuit has a shunt resistor topology.

7. The current sensing circuit of claim 1, wherein the current sensing circuit has a sensing FET transistor topology.

8. The current sensing circuit of claim 1, wherein the correction circuit is further configured to issue the correction signal to auxiliary inputs of the current sense amplifier, the auxiliary inputs separate from inverting input, non-inverting input, and power supply inputs of the current sense amplifier.

9. The current sensing circuit of claim 1, wherein the correction circuit is further configured to determine the correction signal to be issued to the current sense amplifier while the current sensing circuit is configured to measure current across an external load connected to the current sensing circuit.

10. The current sensing circuit of claim 1, wherein the digital integrator and the sensing amplifier are separate.

11. A system, comprising:
   a current sense amplifier; and
   a correction circuit configured to:
      evaluate an offset voltage of the current sense amplifier;
      issue a correction signal to the current sense amplifier based upon the evaluated offset voltage; and
      use a comparator connected to the inputs of the sense amplifier to control a digital integrator configured to generate the correction signal.

12. The system of claim 11, wherein the correction circuit is further configured to evaluate the offset voltage and issue the correction signal continuously.

13. The system of claim 11, wherein the correction circuit is further configured to use the comparator and the digital integrator to generate the correction signal as an input of a digital to analog converter (DAC).

14. A method of sensing current, comprising:
   operating a current sense amplifier; and
   with a correction circuit:
      evaluate an offset voltage of the current sense amplifier;
      issue a correction signal to the current sense amplifier based upon the evaluated offset voltage; and
      use a comparator connected to the inputs of the sense amplifier to control a digital integrator configured to generate the correction signal.

15. The method of claim 14, further comprising, with the correction circuit, evaluating the offset voltage and issue the correction signal continuously.

16. The method of claim 14, further comprising using the comparator and the digital integrator to generate the correction signal as an input of a digital to analog converter (DAC).

17. The method of claim 16, further comprising using the DAC to close a feedback loop of digital Auto-Zero compensation of the current sense amplifier.

18. The method of claim 14, further comprising, with the correction circuit, converting the offset voltage to the correction signal continuously in order to prevent degradation due to a temperature drift of an offset compensation.

19. The method of claim 14, further comprising, with the correction circuit, sensing current from a shunt resistor topology.

20. The method of claim 14, further comprising, with the correction circuit, sensing current from a sensing FET transistor topology.

* * * * *